US009733640B2

(12) United States Patent
Yiin et al.

(10) Patent No.: US 9,733,640 B2
(45) Date of Patent: Aug. 15, 2017

(54) METHOD AND APPARATUS FOR DATABASE-ASSISTED REQUALIFICATION RETICLE INSPECTION

(71) Applicant: KLA-Tencor Corporation, Milpitas, CA (US)

(72) Inventors: Lih-Huah Yiin, Mountain View, CA (US); Venkatraman K. Iyer, Sunnyvale, CA (US); Rui-fang Shi, Cupertino, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 421 days.

(21) Appl. No.: 14/370,101

(22) PCT Filed: Oct. 1, 2012

(86) PCT No.: PCT/US2012/058346
§ 371 (c)(1),
(2) Date: Jul. 1, 2014

(87) PCT Pub. No.: WO2013/106101
PCT Pub. Date: Jul. 18, 2013

(65) Prior Publication Data
US 2015/0005917 A1    Jan. 1, 2015

Related U.S. Application Data

(60) Provisional application No. 61/586,607, filed on Jan. 13, 2012.

(51) Int. Cl.
G06F 19/00    (2011.01)
G05B 19/418   (2006.01)
(Continued)

(52) U.S. Cl.
CPC ......... *G05B 19/41875* (2013.01); *G03F 1/36* (2013.01); *G03F 1/84* (2013.01);
(Continued)

(58) Field of Classification Search
None
See application file for complete search history.

(56) References Cited

U.S. PATENT DOCUMENTS 5,125,040 A  *  6/1992  Matsui .................... H01L 21/30
                                                      257/E21.211
6,784,446 B1 *  8/2004  Phan ................. G01N 21/95692
                                                        250/559.4

(Continued)

FOREIGN PATENT DOCUMENTS

CN       1846170 A       10/2006
WO    2013106101 A1       7/2013

OTHER PUBLICATIONS

"Int'l Application Serial No. PCT/US2012/058346, Preliminary Report on Patentability mailed Jul. 24, 2014", 5 pgs.
(Continued)

Primary Examiner — Adam Lee
(74) Attorney, Agent, or Firm — Kwan & Olynick LLP

(57) ABSTRACT

A method embodiment includes providing a reticle design data that specify a plurality of printable features that are formed on the wafer using the reticle and a plurality of nonprintable features that are not formed on the wafer using such reticle, wherein the reticle design data is usable to fabricate the reticle. A reduced design database is generated from the reticle design data and this reduced design database includes a description or map of the nonprintable features of the reticle, a description or map of a plurality of cell-to-cell regions of the reticle, and a grayscale reticle image that is rasterized from the reticle design data. The reduced design database, along with the reticle, is transferred to a fabrica-
(Continued)

tion facility so that the reduced design database is usable to periodically inspect the reticle in the fabrication facility.

25 Claims, 7 Drawing Sheets

(51) Int. Cl.
    *G03F 1/36*     (2012.01)
    *G03F 1/84*     (2012.01)
    *G06F 17/30*     (2006.01)
    *G03F 1/44*     (2012.01)

(52) U.S. Cl.
    CPC .......... *G06F 17/30587* (2013.01); *G03F 1/44* (2013.01); *G05B 2219/31304* (2013.01)

(56) References Cited

U.S. PATENT DOCUMENTS

| | | | | |
|---|---|---|---|---|
| 6,834,262 B1* | 12/2004 | Balasinski | ................ | G03F 1/36 703/13 |
| 6,999,611 B1* | 2/2006 | Lopez | ............... | G01N 21/95692 382/143 |
| 7,295,695 B1* | 11/2007 | Dayal | ................ | G01N 21/9501 382/145 |
| 2002/0164065 A1* | 11/2002 | Cai | ................. | G01N 21/95607 382/149 |
| 2003/0229412 A1* | 12/2003 | White | ................ | G06F 17/5068 700/121 |
| 2004/0044981 A1* | 3/2004 | Yoshimura | ................ | G03F 1/78 716/52 |
| 2005/0004774 A1 | 1/2005 | Volk et al. | | |
| 2006/0062445 A1* | 3/2006 | Verma | ................ | G06F 17/5068 382/144 |
| 2006/0110837 A1* | 5/2006 | Gupta | ................ | G03F 1/144 438/14 |
| 2006/0161452 A1* | 7/2006 | Hess | ................ | G03F 1/36 716/55 |
| 2007/0157154 A1* | 7/2007 | Socha | ................ | G03F 1/144 430/5 |
| 2008/0072207 A1* | 3/2008 | Verma | ................ | G03F 1/84 716/52 |
| 2008/0082952 A1* | 4/2008 | O'Brien | ................ | G03F 1/36 716/53 |
| 2008/0141211 A1* | 6/2008 | Bruce | ................ | G03F 1/36 716/52 |
| 2008/0163140 A1* | 7/2008 | Fouquet | ................ | G03F 7/7065 700/110 |
| 2008/0170773 A1 | 7/2008 | Wihl et al. | | |
| 2008/0226157 A1 | 9/2008 | Stokowski | | |
| 2009/0127723 A1* | 5/2009 | Zhang | ................ | G03F 7/70633 257/797 |
| 2009/0310136 A1* | 12/2009 | Hess | ................ | G03F 1/144 356/394 |
| 2010/0125823 A1* | 5/2010 | Renwick | ................ | G03F 7/705 716/50 |
| 2011/0142327 A1 | 6/2011 | Chen et al. | | |
| 2011/0229804 A1* | 9/2011 | Yang | ................ | G03F 1/36 430/5 |
| 2011/0276935 A1* | 11/2011 | Fouquet | ................ | G06T 7/0006 716/112 |

OTHER PUBLICATIONS

"Chinese Application Serial No. 201280069844.0, Office Action mailed Mar. 15, 2016", 9 pgs.
"International Application Serial No. PCT/US2012/058346, Search Report and Written Opinion mailed Mar. 29, 2013", 8 pgs.

* cited by examiner

METHOD AND APPARATUS FOR DATABASE-ASSISTED REQUALIFICATION RETICLE INSPECTION

CROSS-REFERENCE TO RELATED APPLICATIONS

This application is a U.S. national application under 5 U.S.C. 371 of PCT Application Number PCT/US12/058,346, entitled "METHOD AND APPARATUS FOR DATABASE-ASSISTED REQUALIFICATION RETICLE INSPECTION", filed 1 Oct. 2012 by Lih-Huah Yiin et al., which claims priority of U.S. Provisional Patent Application No. 61/586,607, entitled "METHOD OF DATABASE-ASSISTED INSPECTION FOR SINGLE-DIE RETICLE REQUALIFICATION IN WAFER FAB", filed 13 Jan. 2012 by Lih-Huah Yiin et al. These applications are herein incorporated by reference in their entirety for all purposes.

TECHNICAL FIELD OF THE INVENTION

The present invention relates generally to inspection systems. More specifically, it relates to inspection of reticles using a design database.

BACKGROUND

Generally, the industry of semiconductor manufacturing involves highly complex techniques for fabricating integrating circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device is fault free prior to shipment to the end users or customers.

An integrated circuit is typically fabricated from a plurality of reticles. Generation of reticles and subsequent optical inspection of such reticles have become standard steps in the production of semiconductors. Initially, circuit designers provide circuit pattern data, which describes a particular integrated circuit (IC) design, to a reticle production system, or reticle writer. The circuit pattern data is typically in the form of a representational layout of the physical layers of the fabricated IC device. The representational layout includes a representational layer for each physical layer of the IC device (e.g., gate oxide, polysilicon, metallization, etc.), wherein each representational layer is composed of a plurality of polygons that define a layer's patterning of the particular IC device.

The reticle writer uses the circuit pattern data to write (e.g., typically, an electron beam writer or laser scanner is used to expose a reticle pattern) a plurality of reticles that will later be used to fabricate the particular IC design. A reticle inspection system may then inspect the reticle for defects that may have occurred during the production of the reticles.

A reticle or photomask is an optical element containing at least transparent and opaque regions, and sometimes semi-transparent and phase shifting regions, which together define the pattern of coplanar features in an electronic device such as an integrated circuit. Reticles are used during photolithography to define specified regions of a semiconductor wafer for etching, ion implantation, or other fabrication process.

After fabrication of each reticle or group of reticles, each reticle is typically inspected by illuminating it with light emanating from a controlled illuminator. A test image of a portion of the reticle is constructed based on the portion of the light reflected, transmitted, or otherwise directed to a light sensor. Such inspection techniques and apparatus are well known in the art and are embodied in various commercial products such as many of those available from KLA-Tencor Corporation of Milpitas, Calif.

During a conventional inspection process, the test image of the reticle is typically compared to a baseline image. Typically, the baseline image is either generated from the circuit pattern data or from an adjacent die on the reticle itself. Either way, the test image features are analyzed and compared with features of the baseline image. Each difference value is then compared with a predetermined threshold value. If the test image varies from the baseline image by more than the predetermined threshold, a defect is defined and reported.

Each difference detected between two images has the potential of resulting in a printable defect. Conversely, some of the detected defects will have no effect on the resulting integrated circuit. Depending on whether this threshold is set too high or too low, this technique can fail to capture small defects and can also capture a high number of "false" defects.

There is a continuing need for improved inspection techniques to accurately and reliably detect defects on reticles or the like, while reducing the number of detected "false" defects.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method of providing design data information for inspection of a reticle in a wafer fabrication facility is disclosed. The method includes providing a reticle design data that specify a plurality of printable features that are formed on the wafer using the reticle and a plurality of nonprintable features that are not formed on the wafer using such reticle, wherein the reticle design data is usable to fabricate the reticle. A reduced design database is generated from the reticle design data and this reduced design database includes a description or map of the nonprintable features of the reticle, a description or map of a plurality of cell-to-cell regions of the reticle, and a grayscale reticle image that is rasterized from the reticle design data. The reduced design database, along with the reticle, is transferred to a fabrication facility so that the reduced design database is usable to periodically inspect the reticle in the fabrication facility.

In a specific implementation, the reticle design data includes non-printable features that are to not be printed on a wafer that is fabricated using the reticle that is formed from such reticle design data. In another embodiment, the reticle design data includes proprietary information and the reduced design database does not include such proprietary information.

In yet another implementation, the description or map of the nonprintable features of the reticle is generated by defining each feature of the grayscale reticle image that has a measured line width below the predefined threshold as a nonprintable feature if such feature is within a predefined distance to another feature of the grayscale reticle image that has a measured line width equal or above the predefined threshold value. In a further aspect, the description or map of the nonprintable features specifies a size and location for each nonprintable feature or region of nonprintable features. In yet a further aspect, the reduced design database include a map of the nonprintable features in the form of a plurality of polygons having a color that differs from a plurality of design polygons contained specified in the reticle design data.

In another embodiment, the description or map of the cell-to-cell regions is generated by detecting repeating patterns in the grayscale reticle image. In a further aspect, the description or map of the cell-to-cell regions specifies a size and location for repeating pattern or each region of repeating patterns. In another example, the nonprintable features of the reticle design data are generated by an algorithm that causes asymmetries in some repeating ones of the printable features.

In another implementation, the method comprises compressing and encrypting the reduced design database prior to transferring the reduced design database, along with the reticle, to a fabrication facility. Compression may be applied to the descriptions or maps of the cell-to-cell regions, descriptions or maps of the nonprintable regions, and any generated grayscale reticle images.

In an alternative embodiment, the invention pertains to a system for providing design data information for inspection of a reticle in a wafer fabrication facility. The system comprising at least one processor and at least one memory that are configure for performing one or more of the above-described operations. In another embodiment, a system for inspecting a reticle in a fabrication facility for fabricating a wafer using such reticle is disclosed. The system includes a fabrication storage system for receiving a reduced design database that was generated from reticle design data, and the reduced design database includes a description or map of the nonprintable features of the reticle, a description or map of a plurality of cell-to-cell regions of the reticle, and a grayscale reticle image that is rasterized from the reticle design data. The system also includes an inspection tool for acquiring images of the reticle and a defect processing system for detecting defects in the reticle by analyzing the acquired images of such reticle based on the reduced design database.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Certain embodiments provide a "lite" or reduced database version of a design database for inspecting reticles in the wafer fabrication facility. For example, a lite design database is extracted from design data for a particular reticle. This lite design database is stored using significantly less storage space than the original design database, as well as using significantly less bandwidth for transmitting and accessing such lite design database. For instance, while the original design data may require a storage size having terabytes units for each reticle, the extracted lite design database for each reticle may only require less than about 200 gigabytes of memory. This lite design database can then be initially used to inspect the particular reticle when it is first received in the fabrication facility. The lite design database may also be used to periodically inspect (requalification) the particular reticle after such wafer is used to fabricate one or more wafers.

Figure 1:
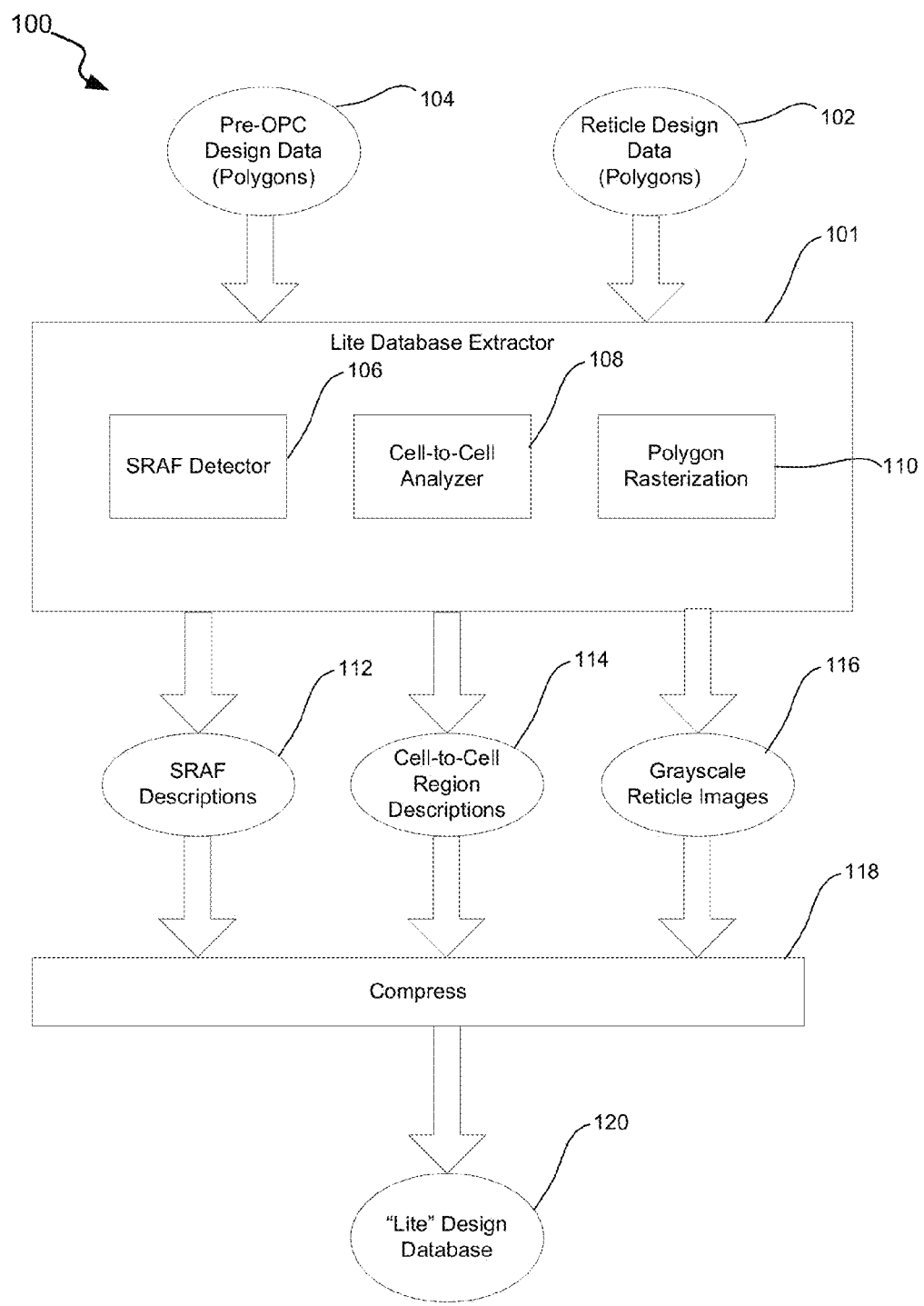
FIG. 1 is a diagrammatic representation of a system for providing a "lite" database for use during reticle inspection in accordance with one embodiment of the present invention.

FIG. 1 is a diagrammatic representation of a mask system 100 for providing a "lite" database for use during reticle inspection in accordance with one embodiment of the present invention. Pre-OPC design data 104 and reticle design data 102 may both be provided to a Lite Database Extractor 101. Pre-OPC design data 104 generally include polygons that were generated by a designer or synthesis tool for a particular reticle prior to any OPC (optical proximity correction) structures being added to the design data. The pre-OPC design data 104 can be said to represent the intention of the designer and will generally resemble the final wafer, which will be fabricated with a reticle that is made using the reticle design data 102. The reticle design data 102 generally include OPC decorations that were added to the pre-OPC reticle design data. The OPC decorations enhance the fabrication of the reticle. For example, a sharper image may be obtained on corners if certain OPC enhancements are added proximate to such corners in the design data.

Lite Database Extractor 101 is generally configured to extract from the pre-OPC design data 104 and reticle design data 102 a small sub-portion of the design data for use during reticle inspection. The extracted design data may take any suitable form for facilitating any type of reticle inspection, such as die-to-database, die-to-die, cell-to-cell, etc. As shown, the Lite Database Extractor 101 may include an SRAF (sub-resolution assist feature) detector 106 for generating SRAF descriptions 112, cell-to-cell analyzer 108 for generating cell-to-cell region descriptions 114, and a polygon rasterization module 110 for generating grayscale reticle images 116. The system 100 may also include a compress module 118 for compressing the data represented by the SRAF descriptions 112, cell-to-cell region descriptions 114, and grayscale reticle images 116 so as to form a compressed lite design database 120.

The polygon rasterization module 110 generates one or more grayscale images that each does not contain as much design detail as the reticle design data 102 (or pre-OPC design data 104). The reticle design data 102 generally contains a list of the exact specifications for each polygon. That is, the reticle design data contains information that describes the polygon design data with a high degree of specificity. The design database also generally contains proprietary intellectual property information. The grayscale images that are generated by the polygon rasterization module 110 have a much lower resolution than the reticle design data 102. For example, the post-OPC design data typically contains a very detailed description of the OPC structures that were generated by the OPC models. Such detailed OPC descriptions specify a list of exact numerical dimensions of the OPC structures so that one could readily determine the OPC models by comparing the post-OPC design data to the pre-OPC design data (e.g., reverse engineering). The generated grayscale reticle image does not contain specific proprietary information, such as the exact numerical dimensions of the OPC structure. In general, a grayscale reticle image is generated so as to have a resolution that allows a die-to-database inspection to detect defects.

The SRAF detector 106 generally generates a representation of each SRAF in the reticle design data 102, for example, based on the gray scale reticle image. For instance, the SRAF detector 106 may provide a list of each SRAF coordinate and shape or size. A map or image of the SRAF features may alternatively be provided. For instance, the SRAF map may include polygons that each corresponds to each region of SRAF's or individual SRAF's, and each SRAF polygon may have a different color than the colors of the other reticle design features/polygons. Several SRAF detector embodiments are described further below.

The cell-to-cell analyzer 108 may be configured to detect repeating patterns in the reticle design data 102. Cell-to-cell regions are generally regions that have been determined to contain repeating patterns or structures, for example, in the grayscale image that was generated from the reticle design data 102. The OPC algorithms may add asymmetries to the reticle design data. Accordingly, the cell-to-cell analyzer 108 may be configured to detect the cell-to-cell regions in the post-OPC design data 102, as opposed to the pre-OPC design data 104 so that regions that were designed to be cell-to-cell, but become asymmetrical from asymmetrical OPC structures, are filtered out of the identified cell-to-cell regions. In one embodiment, the cell-to-cell analyzer 108 generates a list of cell-to-cell region locations, shape, and size. For example, the shape and size of each cell within a particular cell-to-cell region is identified. Alternatively, a map of the cell-to-cell regions is provided, for example, as described with respect to the SRAF map. In general, the cell-to-cell analyzer is configured to analyze each small region of pixels of the grayscale reticle image to determine whether there are one or more other identical neighbor regions of pixels.

Any suitable image compression technique may be used to implement compression module 118. In general, compression includes reducing irrelevant and redundant features. By way of examples, one or more of the following lossless compression techniques may be used: run-length encoding, DPCM (differential pulse-code modulation) encoding, predictive encoding, entropy encoding, deflation encoding, or chain encoding. In a specific algorithm, run-length encoding involves storing a single data value for a sequence of the same data values. For instance, a string of 10 black pixels, with each having value B, may be replaced with a single value of 10B. Thus, 10 characters (10 B's) would be reduced to 3 characters (10B). The compression module may also include any suitable image encryption techniques, such as the Lempel-Ziv-Markov chain Algorithm (LZMA).

Figure 2:
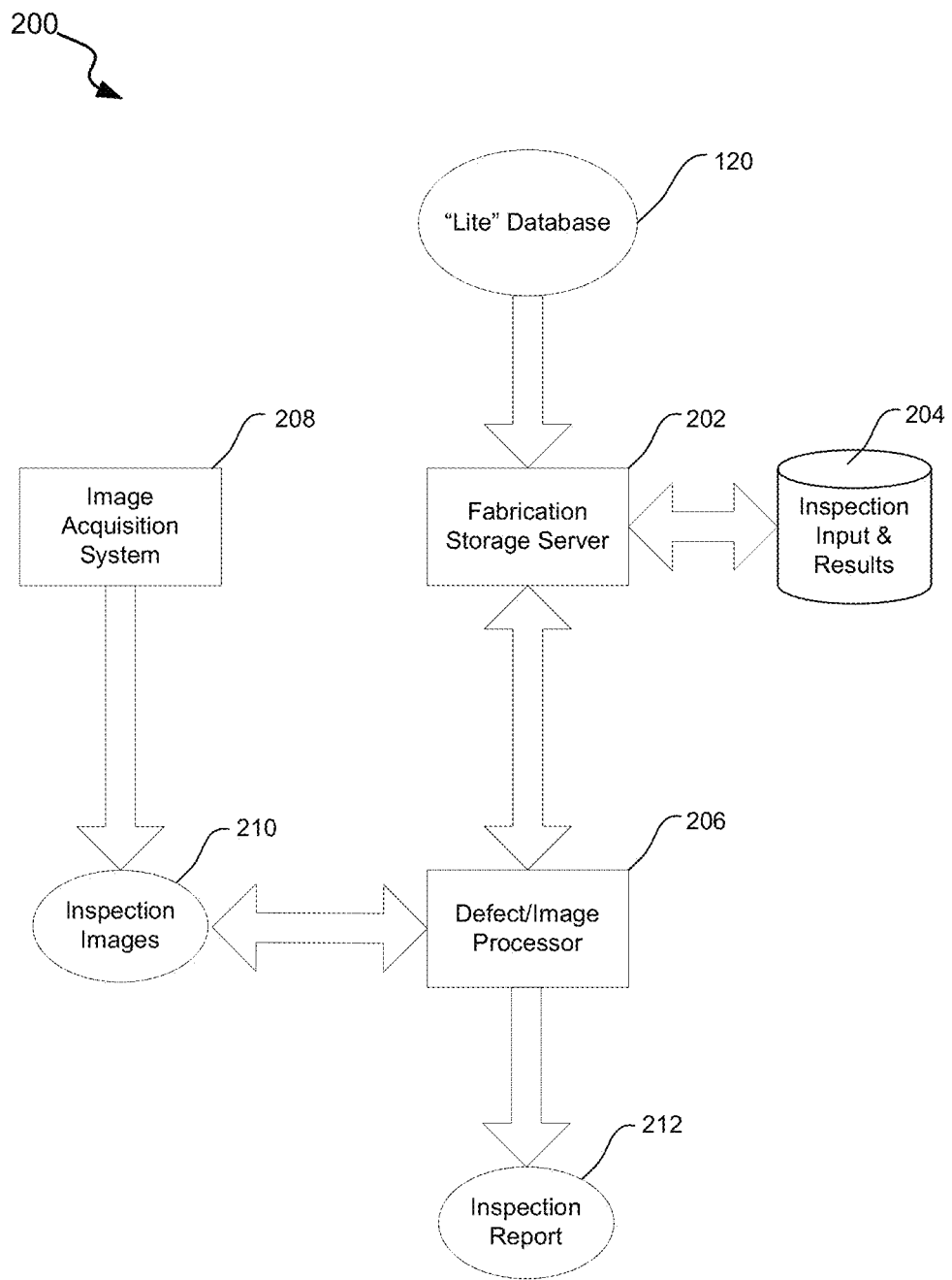
FIG. 2 is a diagrammatic representation of a system for inspecting a reticle based on an extracted "lite" design database in accordance with one embodiment of the present invention.

FIG. 2 is a diagrammatic representation of a system 200 for inspecting a reticle based on an extracted "lite" design database in accordance with one embodiment of the present invention. The components described with respect to FIG. 2 may be integrated into one or more physical devices and are not limited to the individual devices or systems shown in FIG. 2. As shown, the extracted lite database 120 may be received into a fabrication storage system or server 202 that is associated with one or more storage devices 204. The fabrication storage server 202 is configured to store the received lite database 120 in such one or more storage devices 204. In one embodiment, the lite database 120 is stored in an inspection input and results database maintained in one or more storage devices 204 by storage server 202.

The inspection system 200 may also include an image (or signal) acquisition system 208 for acquiring inspection image (or signals) 210 from a reticle. The system 200 may also include a defect or image processor 206 for analyzing images received from the inspection system 208. The defect processor 206 determines whether the acquired images (or signals) contain defects. The lite database is used to facilitate this defect detection process. For instance, the SRAF descriptions may be used to de-sense the inspection for the SRAF regions (e.g., inspect with a higher threshold). The image processor receives knowledge of the SRAF regions (e.g., location, size, etc.), along with the acquired images, and does not have to spend resources determining SRAF regions. The cell-to-cell descriptions may be used to implement a faster, more sensitive algorithm for the cell-to-cell regions. The defect or image processor 206 may also be configured to generate an inspection report 212, and this report may include defect images, defect classification, and defect locations within the reticle/die.

The image acquisition system 208 may take the form of any suitable tool for inspecting reticles and obtaining inspection images (or signals) as described further below. In one embodiment, the image acquisition system 208 is configured to scan the reticle with an optical beam and obtain images of individual portions of the reticle as the beam is scanned across the reticle. For example, the image acquisition system 208 obtains a plurality of image swaths across the reticle, and these image swaths are sent to the image processor for detecting defects. Alternatively, the image acquisition system may take the form of a scanning electron microscope (SEM).

Figure 3:
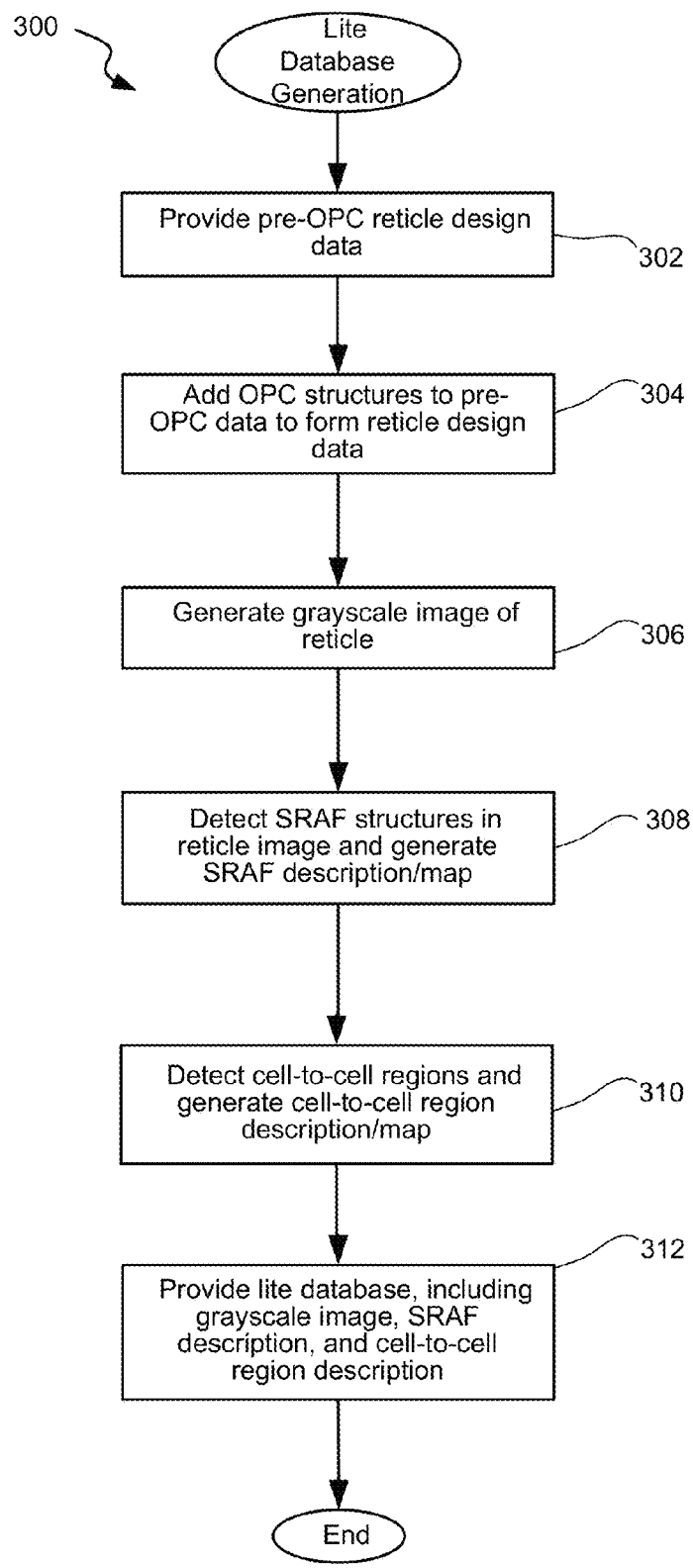
FIG. 3 is a flow chart illustrating a procedure for generating a lite design database in accordance with a specific implementation of the present invention.

FIG. 3 is a flow chart illustrating a procedure 300 for generating a lite design database in accordance with a specific implementation of the present invention. Initially, pre-OPC reticle design data is provided in operation 302. The polygons of the pre-OPC reticle design data may be generated by one or more people using any suitable layout tool. Additionally or alternatively, polygons may be generated by any suitable synthesis tool based on a design represented by hardware description language (HDL), such as Verilog, where the HDL design may also be generated by one or more people. The HDL design may comprise custom components and/or standard components that are available in a component library. The term "design data" generally represents the physical design (layout) of an IC (integrated circuit). Pre-OPC design data represents the physical design layout of a device being fabricated on a wafer or to be fabricated on the wafer (e.g., information obtained from a data structure such as a graphical data stream (GDS) file, GDSII file, or another standard file or database). The information from the GDS file, other file, or database may describe the physical design layout pre-decoration (e.g., without optical proximity correction (OPC) features and any other resolution enhancement technology (RET) features added to the design).

OPC structures may then be added to the pre-OPC data to form reticle design data in operation 304. One or more OPC-generating models may be applied to the pre-OPC design so that OPC structures are generated based on such models. The models may be based on experimental and/or simulation results. In general, the terms OPC, SRAF, thin-line, and non-printable structures are used interchangeably herein.

Grayscale reticle images may also be generated in operation 306. For example, the inspection tool optics are modeled and applied to the design data patterns to obtain a grayscale reticle image. Grayscale images may be generated for both reflected and transmission optical components of the inspection tool. A grayscale image may be generated from only the post-OPC design data. In alternative embodiments, a grayscale image of the pre-OPC data may also be generated.

SRAF structures in the grayscale reticle image may also be detected and an SRAF description or map generated in operation 308. In general, any suitable approach may be used to separate printable features (also referred to as main features) from non-printable features (also referred to as thin lines) in the design data for later "de-sensing" areas containing non-printable features during reticle inspection. In one simple technique, the pre-OPC design data is compared to the post-OPC design data to determine the locations of the nonprintable features in the post-OPC design data, as well as the grayscale reticle image. For instance, a "Boolean" operation may be used to subtract the pre-OPC data from the post-OPC data to result in the SRAF or nonprintable feature data.

Figure 4A:
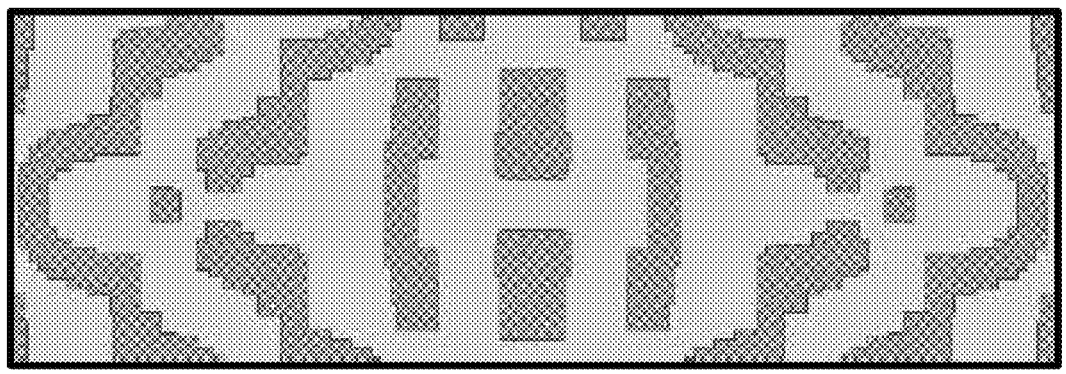
FIG. 4A illustrates a base pattern provided on a photomask in accordance with certain embodiments.
Figure 4B:
FIG. 4B illustrates a resulting wafer image of the base pattern in FIG. 4A after a lithographic transfer.
Figure 4B:
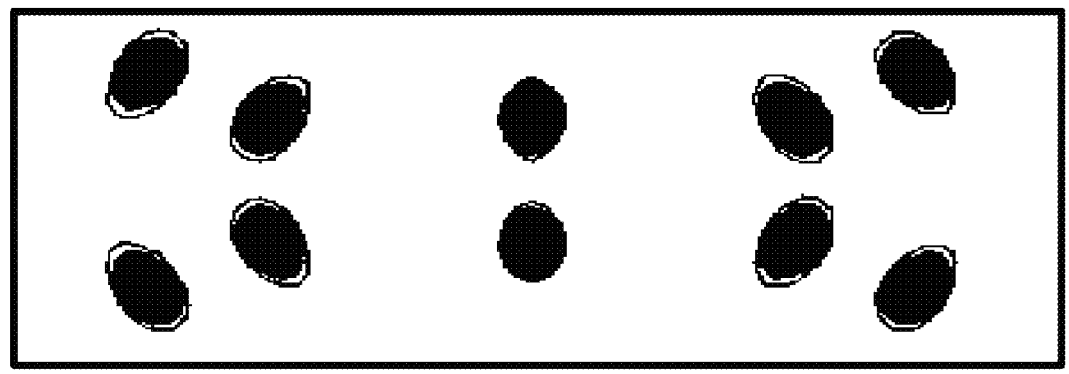

A printable feature can be defined as a feature that appears on a resulting wafer image. Such printed feature may or may not be present on the resulting wafer in the same shape or form as on a reticle or photomask. For example, FIG. 4A illustrates a base pattern provided on a photomask, while FIG. 4B illustrates a resulting wafer image of that base pattern. Therefore, in the context of a photomask, a printable feature may be understood as an area corresponding to the printable feature on a wafer plane. Non-printable features (or "thin lines") may include various optical proximity correction (OPC) features that are used to compensate for imaging errors due to diffraction and other reasons. One type of such non-printable features is sub-resolution assist features (SRAF).

Figure 5:
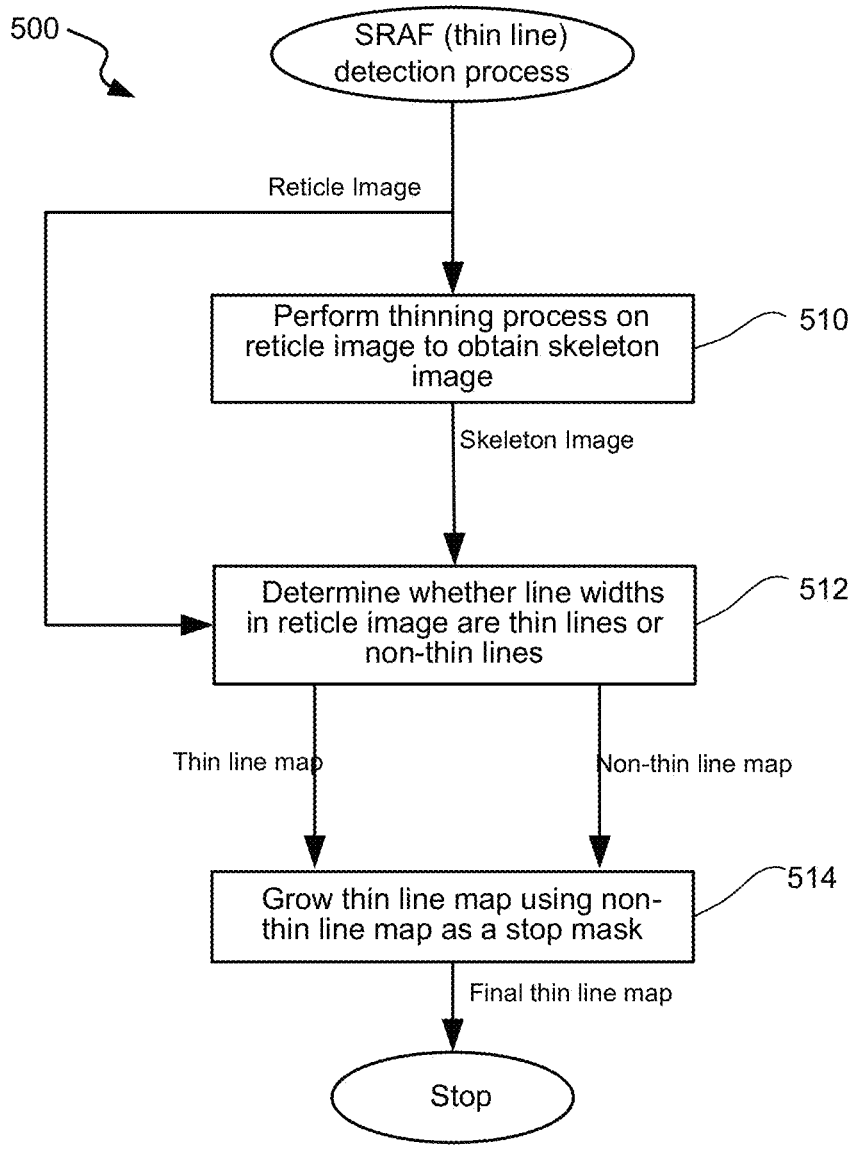
FIG. 5 is a flowchart of a procedure for thin line detection for a photomask based on a grayscale reticle image according to an exemplary embodiment of the present invention.

FIG. 5 is a flowchart of a procedure 500 for thin line detection for a reticle based on a grayscale reticle image according to an exemplary embodiment of the present invention. In the examples described herein, thin line detection includes detection of any non-printable of lithographically insignificant feature of the photomask. The terms "thin line", "non-printable", and "lithographically insignificant" are used herein interchangeably.

Figure 6:
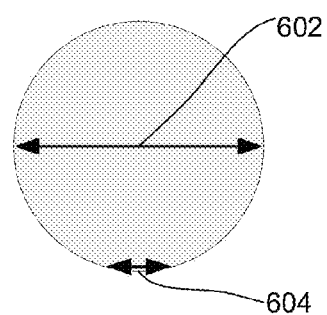
FIG. 6 illustrates obtaining varying line widths at different locations on a circle contour.

The grayscale reticle image includes patterns, geometries, features, shapes, etc. ("patterns"), and the patterns can be defined by a set of contours, lines, boundaries, edges, curves, etc. ("contours"), which generally surround, enclose, and/or define the boundary of the various regions which constitute a pattern on the mask. Line width may be difficult to ascertain on particular contours. For example, the line width measurement of a circle contour may vary depending on where the measurement is obtained as illustrated in FIG. 6. As shown, a line width 602 measured through the center of the circle will be much larger than a line width 604 measured through an edge of the circle.

Accordingly, a process may be used to determine where to measure line widths on the image mask. In one embodiment, a thinning process may be performed on the reticle image to obtain a skeleton image in operation 510. In general, each pattern of the reticle image may be reduced in size so as to provide a site or location in the reticle image for later measuring line width on the particular reticle image pattern. For instance, the skeleton for a circle is a pixel in the center of the circle so that the line width is obtained through the center of the circle on the reticle image, and the skeleton for a line is a line that is 1 pixel wide so that the line width of the line can be obtained anywhere along the line's longitudinal axis.

After the reticle image is thinned to produce a skeleton image, the skeleton and reticle images are then used to determine whether line widths in the reticle image can be defined as thin line patterns or non-thin line patterns in operation 512. This line width check results in both a thin line map and a non-thin line map. In general, the skeleton image is used to measure line widths on the reticle image and compare the measured line widths to a line width specification for thin lines (or non-thin lines). If the measured line width is less than the line width specification, the associated pattern is defined as a thin line. The line width check may also include only defining a feature as a thin-line if such feature is within a predefined proximity to a non-thin feature. If the measured line width is equal to or greater than the line width specification, the associated pattern is defined as a non-thin line. Thus, particular patterns on the reticle image can be defined as thin line or non-thin line areas to produce both a thin line and non-thin line map.

The reticle image may also be defined in terms of a level set function. In one embodiment, the level set function is equal to 0 at the boundary or contour; less than 0 for outside the contour; and more than 0 for inside the contour. The level set 0 function (or whatever function defines the contours) can be used to measure critical dimension (CD) on the mask image. That is, CD can be directly measured on the $0^{th}$ level set function (or the defined contours). For example, four CD measurements on each feature contour may be taken in four directions and the minimum is defined as the CD for such feature.

When a level set function is provided, the zero crossing of the function is the particular contour itself. A direct measurement of line width on this contour along multiple directions can be performed. Finally, taking the minimum of these measurements can then be used to approximate the line width. For main feature protection, the line width check can be the sole criteria to decide if a pattern is thin line or large line pattern.

Further when pixels have the same tone as the thin line, but their line widths are larger than the user defined line width specification, such pixels can be treated as non-thin line pixels. These non-thin line pixels form the large geometry map (or non-thin line map) image that needs to be protected against thin line growth. During thin line growth, this image can be used as the reticle to stop unwanted growth in operation 514. Thus, thin line growth is prevented from encroaching large geometries areas of the reticle image to result in a final thin-line map (or inversely non-thin line map), referred to herein as a feature map.

Referring back to FIG. 3, cell-to-cell regions may also be detected and a cell-to-cell region description or map may also be generated in operation 310. In one embodiment, a group of pixels in the grayscale reticle image are analyzed to determine whether there are any identical neighbor groups of pixels. Identical pixel groups can be identified as cell-to-cell regions. Several techniques for detecting repeating patterns in an image are described in U.S. Pat. No. 7,065,239 to Maayah et al. and U.S. Pat. No. 7,925,072, which patents are incorporated herein by reference. In one embodiment, the grayscale reticle image may be divided into relatively small blocks and an array-metric may then be determined for each block. The array-metric represents the likelihood that the block includes an array pattern. A pre-defined threshold may then be applied to the metric to classify each block as an array or random block. Finally, connected array blocks may be merged into array areas.

A lite design database for a particular reticle is then provided in operation 312. The lite design database for a particular reticle includes one or more grayscale reticle images, SRAF descriptions, and cell-to-cell region descriptions. For example, the lite design database is transferred via a network or storage device from the facility for making the particular reticle (based on the design data for such reticle) and to the facility for fabricating wafers using such particular reticle. The lite database for a particular set of reticles may be provided to the wafer fabrication facility along with initial reticle inspection reports that were generated from an inspection of the particular set of reticles performed at the reticle fabrication facility. The procedure for generating a lite database may be repeated for each of the reticles of a design. The lite database for all of the reticles of a particular design may be transferred together to the wafer fabrication facility.

The lite database information may be used to adjust wafer inspection sensitivity, dramatically reduce nuisance event detection, increase the precision of classifying defects, and enhance applications for inspection systems such as process window qualification (PWQ). The lite design database can also be used to provide advantages for defect review processes and systems as described further herein. In addition, examples of methods that use design data and context data are illustrated in U.S. Pat. No. 6,886,153 to Bevis and U.S. patent application Ser. No. 10/883,372 filed Jul. 1, 2004 published on Jan. 6, 2005 as U.S. Patent Application Publication No. 2005/0004774 by Volk et al., which are incorporated herein by reference. The methods described herein may include any step(s) of any of the method(s) described in this patent and patent application.

By way of an example application, a faster, more sensitive inspection algorithm (lower threshold) may be used for identified cell-to-cell regions. In contrast, a less sensitive inspection (higher threshold) may be used for the identified SRAF regions. A less sensitive SRAF inspection can significantly reduce the detection of "nuisance" or false defects. The inspection tool does not have to be configured to detect SRAF regions or cell-to-cell regions since SRAF and cell-to-cell regions are identified in the provided lite design database. In sum, different inspection algorithms may be used to inspect the SRAF regions, cell-to-cell regions, and other regions of a reticle.

A cell-to-cell description or map that is generated from reticle design data will generally be more accurate than cell-to-cell region descriptions that are generated from the reticle image. When using only cell images, it is difficult to clearly distinguish between an asymmetry that is caused by a real defect and an intended asymmetry caused by the OPC algorithm. The cell-to-cell descriptions allow the intended asymmetries from the OPC algorithms to be excluded in the cell-to-cell defect analysis. Additionally, cell-to-cell regions that are identified from a reticle image may result in inaccuracies that are caused by the intrinsic optical resolution limit of any imaging system.

The lite design database allows die-to-database inspection in a fabrication setting. Without extracting a lite version of the full design database, the transferring of a full design database from a mask making facility to a wafer fabrication facility would consume significant time and storage resources so as to render a die-to-database inspection impractical in a wafer fabrication environment. Additionally, the lite design database facilitates a die-to-database inspection of reticle regions that do not contain cell-to-cell regions. That is, the grayscale reticle images allow the inspection to occur on all the pixels of reticle image obtained from the physical reticle. For example, the inspection may include comparing all regions of a particular reticle to its corresponding region in the grayscale reticle image. If a reticle contains only contains a single die and a grayscale reticle image were not provided, the inspection would have to rely on a cell-to-cell type of inspection since there are no other adjacent dies to image and compare to each other.

In general, any suitable type of photomask or reticle may be used in the process. For example, a photomask made from a transparent fused silica blank with a pattern defined by a chrome metal adsorbing film can be used. In general, a photomasks or mask may take the form of any suitable type of reticle or photomask, e.g., phase shift masks, and Embedded Phase Shift Masks (EPSMs). A photomask generally includes a plurality of printable features and a plurality of non-printable features.

Figure 7:
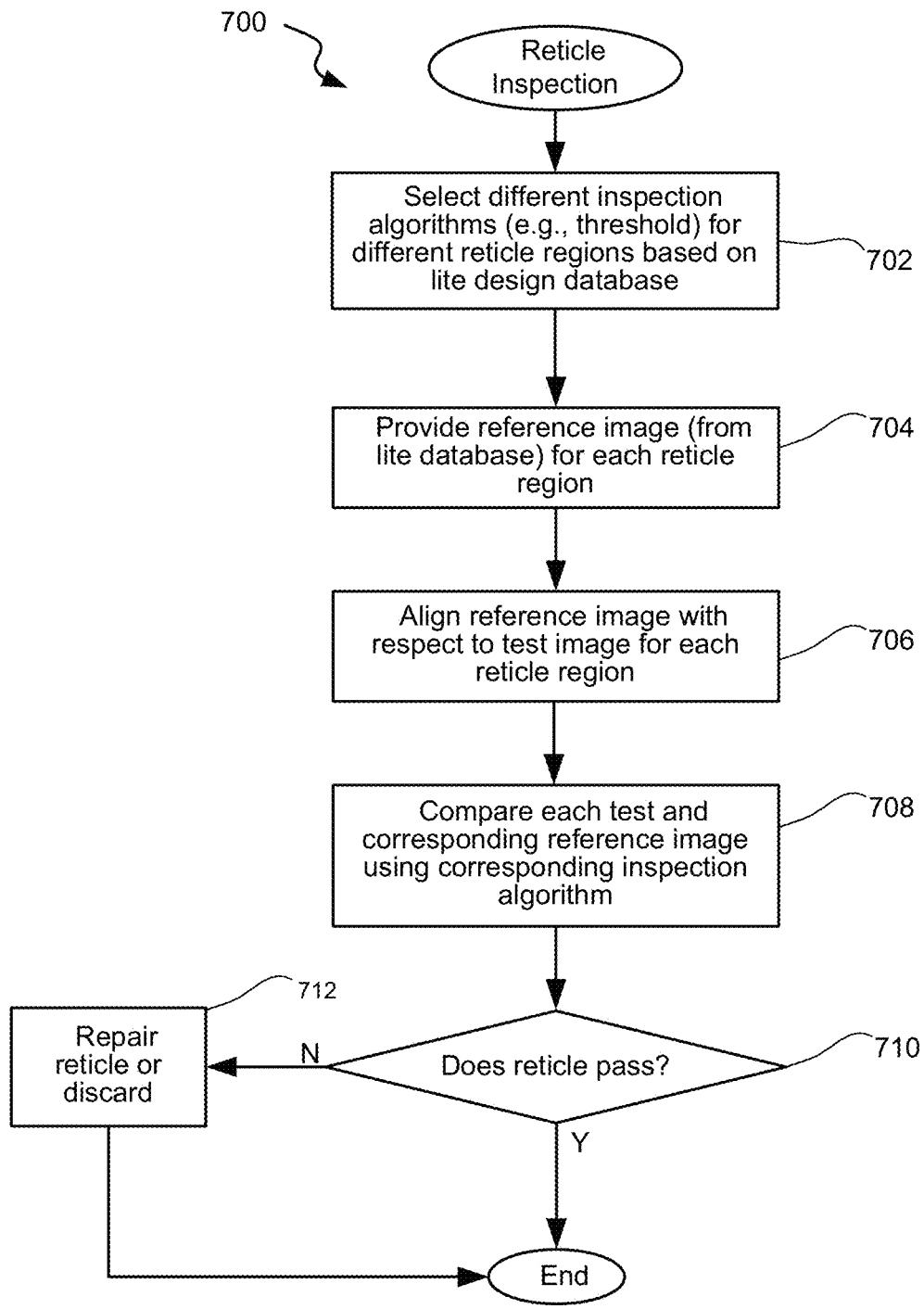
FIG. 7 is a flowchart illustrating a reticle inspection procedure in accordance with one embodiment of the present invention.

FIG. 7 is a flowchart illustrating a reticle inspection procedure in accordance with one embodiment of the present invention. Initially, different inspection algorithms (e.g., different thresholds or algorithms) may be selected for use with different reticle regions based on the lite design database in operation 702. Selecting different inspection algorithms may involve providing one or more user-defined detection thresholds to a same algorithm or selecting different algorithms with a same or different threshold. For example, areas having main features that are not identified as non-printable thin line features may be assigned one detection threshold, while areas that are identified as containing SRAFs or other non-printable thin line feature may be assigned a lower threshold. This differentiation can be used to optimize inspection resources. Additionally, a cell-to-cell inspection algorithm may be used for identified cell-to-cell regions.

A reference image for each reticle region may be provided in operation 704. In a die-to-database inspection, a reference image may be obtained from the lite design database (the generated grayscale reticle image). Alternatively, in a die-to-die or cell-to-cell inspection, the reference image may be obtained from another die or cell of the reticle.

For each reticle region, the reference image may be aligned with respect to the test image in operation 706. In operation 708, each test image is compared to its corresponding reference image using the inspection algorithm that was selected for such region. MEEFs, user defined thresholds, geometrical map, and other information specific for each region may be used in this operation. In other words, analysis of the test image may involve identifying portions of the test image and corresponding portions of the reference image and identifying any differences in these images for each identified portion. In a specific embodiment, differences are identified between aligned test transmitted and reference transmitted images and between aligned test reflected and the reference reflected images.

It may then be determined based on the comparison results whether the reticle passes inspection in operation 710. If the reticle passes, the inspection process may end, and fabrication may proceed using the passing reticle. If the reticle does not pass, the reticle can either be repaired or discarded in operation 712 and inspection ends.

In general, the lite design database can be specifically used to define and focus on areas that contain lithographically significant features and defects during reticle inspection. SRAF descriptions/maps can be used to provide instructions to the inspection system to "de-sense" areas defined as thin-line or nonprintable features during inspection. For example, areas containing only thin lines (e.g., SRAFs) may be inspected with lower sensitivity, than areas containing main features (printable or non-thin line features). As indicated above, areas of the thin line feature map distinguish between these two types of features. Overall, novel processes and inspection systems described herein allow a more effective reticle inspection process.

Figure 8A:
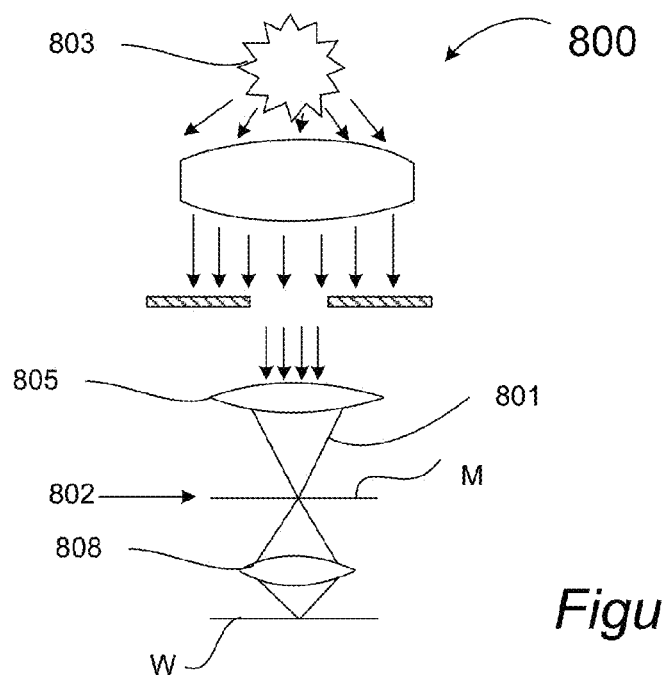
FIG. 8A is a simplified schematic representation of a lithographic system for transferring a mask pattern from a photomask onto a wafer in accordance with certain embodiments.

FIG. 8A is a simplified schematic representation of a typical lithographic system 800 that can be used to transfer a mask pattern from a photomask M onto a wafer W in accordance with certain embodiments. Examples of such systems include scanners and steppers, more specifically PAS 5500 system available from ASML in Veldhoven, Netherlands. In general, an illumination source 803 directs a light beam through an illumination lens 805 onto a photomask M located in a mask plane 802. The illumination lens 805 has a numeric aperture 801 at that plane 802. The value of the numerical aperture 801 impacts which defects on the photomask are lithographic significant defects and which ones are not. A portion of the beam that passes through the photomask M forms a patterned optical signal that is directed through imaging optics 808 and onto a wafer W to initiate the pattern transfer.

Figure 8B:
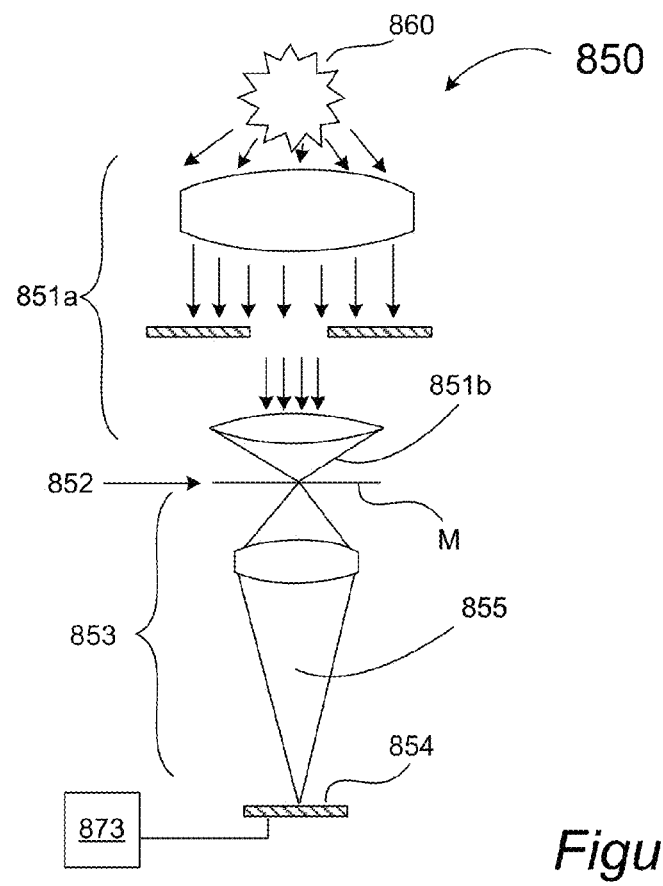
FIG. 8B provides a schematic representation of a photomask inspection apparatus in accordance with certain embodiments.

FIG. 8B provides a schematic representation of an inspection system 850 that has an imaging lens 851*a* with a relative large numerical aperture 851*b* at a reticle plane 852 in accordance with certain embodiments. The depicted inspection system 850 includes microscopic magnification optics 853 designed to provide, for example, 60-200× magnification for enhanced inspection. The numerical aperture 851*b* at the reticle plane 852 of the inspection system is often considerable greater than the numerical aperture 801 at the reticle plane 802 of the lithography system 800, which would result in differences between test inspection images and actual printed images. Each of these optical systems (800, 850) induces different optical effects in the produced images, which may be accounted and compensated for in the techniques described herein.

The inspection techniques described herein may be implemented on various specially configured inspection systems, such as the one schematically illustrated in FIG. 8B. The system 850 includes an illumination source 860 producing a light beam that is directed through illumination optics 851*a-b* onto a photomask M in the reticle plane 852. Examples of light sources include lasers or filtered lamps. In one example, the source is a 193 nm laser. As explained above, the inspection system 850 has a numerical aperture 851*b* at the reticle plane 852 that may be greater than a reticle plane numerical aperture (e.g., element 801 in FIG. 8A) of the corresponding lithography system. The photomask M to be inspected is placed at the reticle plane 852 and exposed to the source.

The patterned image from the mask M is directed through a collection of magnification optical elements 853, which project the patterned image onto a sensor 854. Suitable sensors include charged coupled devices (CCD), CCD arrays, time delay integration (TDI) sensors, TDI sensor arrays, photomultiplier tubes (PMT), and other sensors. In a reflecting system, optical elements would direction and capture the reflected image.

The signals captured by the sensor 854 can be processed by a computer system 873 or, more generally, by a signal processing device, which may include an analog-to-digital converter configured to convert analog signals from the sensor 854 into digital signals for processing. The computer system 873 may be configured to analyze intensity, phase, and/or other characteristics of the sensed light beam. The computer system 873 may be configured (e.g., with programming instructions) to provide a user interface (e.g., on a computer screen) for displaying resultant test images and other inspection characteristics. The computer system 873 may also include one or more input devices (e.g., a keyboard, mouse, joystick) for providing user input, such as changing detection threshold. In certain embodiments, the computer system 873 is configured to carry out inspection techniques detailed below. The computer system 873 typically has one or more processors coupled to input/output ports, and one or more memories via appropriate buses or other communication mechanisms. A similar computer system may be used to implement the techniques for generating a reduced design database as described herein.

Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

In certain embodiments, a system for inspecting a photomask includes at least one memory and at least one processor that are configured to perform the following operations: producing test light intensity images of a mask that include a test transmitted image and a test reflected image, constructing a spot image, restoring the spot image to a mask image, line thinning, creating a feature map, and analyzing the test light intensity images using the feature map to identify photomask defects. One example of an inspection system includes a specially configured TeraScan™ DUV inspection system available from KLA-Tencor of Milpitas, Calif.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method comprising:
providing design data for a reticle that specify cell-to-cell regions containing repeating patterns or structures in the reticle and reticle dimension descriptions having a particular resolution, wherein the reticle design data is usable to fabricate the reticle;
generating, from the cell-to-cell regions, cell-to-cell region descriptions for only the identical regions of the cell-to-cell regions and generating, from the reticle dimension descriptions, a grayscale image of the reticle that has a lower resolution than the particular resolution of the dimension descriptions of the reticle;
generating a design database that includes the generated cell-to-cell region descriptions and the grayscale image of the reticle;
compressing and encrypting the design database to produce a reduced design database; and
using the reduced design database to inspect the reticle by scanning a beam across the reticle in an inspection tool and thereby acquiring an image of the reticle with a sensor of the inspection tool.

2. The method of claim 1, wherein the reduced design database for the reticle has a size less than 200 gigabytes.

3. The method of claim 1, wherein the reticle design data further includes non-printable features of the reticle that are to not be printed on a wafer that is fabricated using the reticle that is formed from such reticle design data.

4. The method of claim 3, further comprising generating a description or map of the nonprintable features of the reticle by defining each feature of the grayscale reticle image that has a measured line width below a predefined threshold as a nonprintable feature if such feature is within a predefined distance to another feature of the grayscale reticle image that has a measured line width equal or above the predefined threshold value.

5. The method of claim 4, wherein the description or map of the nonprintable features specifies a size and location for each nonprintable feature or region of nonprintable features.

6. The method of claim 5, wherein the generated design database further includes a map of the nonprintable features in the form of a plurality of polygons having a color that differs from a plurality of design polygons specified in the reticle design data.

7. The method of claim 1, wherein the reticle design data further includes proprietary information and the reduced design database does not include such proprietary information.

8. The method of claim 1, wherein the cell-to-cell region descriptions are generated by detecting repeating patterns in the grayscale reticle image.

9. The method of claim 8, wherein the cell-to-cell region descriptions specify a size and location for each of the detected repeating patterns or each region of the detected repeating patterns.

10. The method of claim 1, further comprising generating nonprintable features of the reticle design data by an algorithm that causes asymmetries in some repeating ones of the printable features of the reticle design data.

11. A system comprising at least one processor and at least one memory that are configured for performing the following operations:
receiving design data for a reticle that specify cell-to-cell regions containing repeating patterns or structures in the reticle and reticle dimension descriptions having a particular resolution, wherein the reticle design data is usable to fabricate the reticle;
generating, from the cell-to-cell regions, cell-to-cell region descriptions for only the identical regions of the cell-to-cell regions and generating, from the reticle dimension descriptions, a grayscale image of the reticle that has a lower resolution than the particular resolution of the dimension descriptions of the reticle;
generating a design database that includes the generated cell-to-cell region descriptions and the grayscale image of the reticle;
compressing and encrypting the design database to produce a reduced design database; and
using the reduced design database to inspect the reticle by scanning a beam across the reticle in an inspection tool and thereby acquiring an image of the reticle with a sensor of the inspection tool.

12. The system of claim 11, wherein the reticle design data further includes non-printable features of the reticle that are to not be printed on a wafer that is fabricated using the reticle that is formed from such reticle design data.

13. The system of claim 12, wherein the at least one processor and at least one memory are further configured for generating a description or map of the nonprintable features of the reticle by defining each feature of the grayscale reticle image that has a measured line width below a predefined threshold as a nonprintable feature if such feature is within a predefined distance to another feature of the grayscale reticle image that has a measured line width equal or above the predefined threshold value.

14. The system of claim 13, wherein the description or map of the nonprintable features specifies a size and location for each nonprintable feature or region of nonprintable features.

15. The system of claim 14, wherein the generated design database further includes a map of the nonprintable features in the form of a plurality of polygons having a color that differs from a plurality of design polygons specified in the reticle design data.

16. The system of claim 12, wherein the nonprintable features of the reticle design data are generated by an algorithm that causes asymmetries in some repeating ones of the printable features of the reticle design data.

17. The system of claim 11, wherein the reticle design data further includes proprietary information and the reduced design database does not include such proprietary information.

18. The system of claim 11, wherein the cell-to-cell region descriptions are generated by detecting repeating patterns in the grayscale reticle image.

19. The system of claim 18, wherein the cell-to-cell region descriptions specify a size and location for each of the detected repeating patterns or each region of the detected repeating patterns.

20. A system comprising:
the system of claim 11; and a defect processing system for detecting defects in the reticle by analyzing the acquired image of such reticle based on the reduced design database.

21. The system of claim 20, wherein the defect processing system is further configured to detect defects by analyzing a test image of the reticle using a plurality of different inspection algorithms, wherein a first sensitivity level of a first one of the inspection algorithms is less in first areas of the test image defined by a portion of the reduced design database than a second sensitivity level of a second one of the inspection algorithms for other areas of the test image that are not defined by the reduced design database.

22. The system of claim 21, wherein the analysis of the test image is accomplished by comparing the image to a reference image that corresponds to a portion of the grayscale reticle image.

23. The system of claim 21, wherein the analysis of the image is accomplished by comparing the test image to a reference image obtained from a reference die or reference cell of the reticle.

24. The system of claim 21, wherein the first sensitivity level is selected based on a description or map of the nonprintable features of the reticle.

25. The system of claim 21, wherein the second sensitivity level is selected based a description or map of a plurality of cell-to-cell regions of the reticle.

* * * * *